(12) United States Patent  
Iliev et al.

(10) Patent No.: US 8,149,001 B2
(45) Date of Patent: Apr. 3, 2012

(54) LOW COST FINGERPRINT SENSOR SYSTEM

(75) Inventors: Simeon K. Iliev, Forest Hills, NY (US); Drew J. Dutton, Austin, TX (US)

(73) Assignee: Standard Microsystems Corporation, Hauppauge, NY (US)

( * ) Notice: Subject to any disclaimer, the term of this patent is extended or adjusted under 35 U.S.C. 154(b) by 574 days.

(21) Appl. No.: 12/359,056

(22) Filed: Jan. 23, 2009

(65) Prior Publication Data

US 2010/0039121 A1 Feb. 18, 2010

Related U.S. Application Data

(60) Provisional application No. 61/089,259, filed on Aug. 15, 2008.

(51) Int. Cl.
G01R 27/26 (2006.01)
(52) U.S. Cl. .......................................... 324/686; 324/658
(58) Field of Classification Search .................. 324/658, 324/649, 600, 662, 661, 686
See application file for complete search history.

(56) References Cited

U.S. PATENT DOCUMENTS

| 5,327,164 | A  | * | 7/1994  | Fagard et al. ............... 345/174 |
| 5,436,944 | A  | * | 7/1995  | Magnin et al. .............. 376/249 |
| 6,213,403 | B1 | * | 4/2001  | Bates, III .................... 235/492 |
| 6,501,284 | B1 | * | 12/2002 | Gozzini ........................ 324/681 |
| 6,924,496 | B2 | * | 8/2005  | Manansala .................. 250/556 |
| 7,256,589 | B2 | * | 8/2007  | Andrade ...................... 324/687 |
| 2007/0067640 | A1 | * | 3/2007 | Murata et al. ............... 713/186 |
| 2008/0094807 | A1 | * | 4/2008 | Hiew et al. .................. 361/737 |
| 2008/0280490 | A1 | * | 11/2008 | Nguyen et al. .............. 439/607 |
| 2009/0067690 | A1 |   | 3/2009  | Mainguet |
| 2009/0073632 | A1 |   | 3/2009  | Yang et al. |
| 2009/0103787 | A1 |   | 4/2009  | Chen et al. |

* cited by examiner

Primary Examiner — Hoai-An D Nguyen
(74) Attorney, Agent, or Firm — Meyertons Hood Kivlin Kowert & Goetzel, P.C.; Jeffrey C. Hood; Stephen J. Curran

(57) ABSTRACT

Low cost fingerprint system having a single chip solution includes a circuit board, a fingerprint sensor array fabricated onto a first surface of the circuit board, and an integrated circuit die for processing information received from the fingerprint sensor array is mounted directly to a second surface of the circuit board. The integrated circuit die may be electrically connected to the sensor by, for example, vias in the circuit board.

16 Claims, 3 Drawing Sheets

LOW COST FINGERPRINT SENSOR SYSTEM

PRIORITY CLAIM

This application claims priority to Provisional Patent Application Ser. No. 61/089,259 filed Aug. 15, 2008, and entitled "Low Cost Fingerprint Sensor System", which is hereby incorporated by reference in its entirety as though fully and completely set forth herein.

BACKGROUND OF THE INVENTION

1. Field of the Invention

This invention relates to fingerprint sensor technology and, more particularly, to a system including a low cost fingerprint sensor assembly.

2. Description of the Related Art

Many systems employ fingerprint authentication devices for user authentication and identification. For example, security systems, computer systems, and even amusement park entry systems employ such sensors and systems. As the trend toward better security for computing platforms and mobile devices increases, the demand for finger print authentication is increasing. However, conventional fingerprint sensor systems can be complex and include multiple specialized components mounted to a circuit board, such as a printed circuit board (PCB), using integrated circuit (IC) packages such as ball grid array (BGA) packages, for example. Thus, these conventional sensor systems can be expensive and may have a lower mean time between failure (MTBF) due to the higher component count. Therefore, to proliferate fingerprint sensor technologies into more and less expensive systems, it may be desirable to have a more cost effective fingerprint sensor system.

SUMMARY

Various embodiments of a low cost fingerprint sensor system are disclosed. In one embodiment, the low cost fingerprint system includes a circuit board such as a printed circuit board or printed wire board, for example. The system also includes a fingerprint sensor array fabricated onto a first surface of the circuit board, and an integrated circuit die for processing information received from the fingerprint sensor is mounted directly to a second surface of the circuit board using, for example, chip-on-board mounting technology. The integrated circuit die may be electrically connected to the sensor by, for example, vias in the circuit board.

Figure 1:
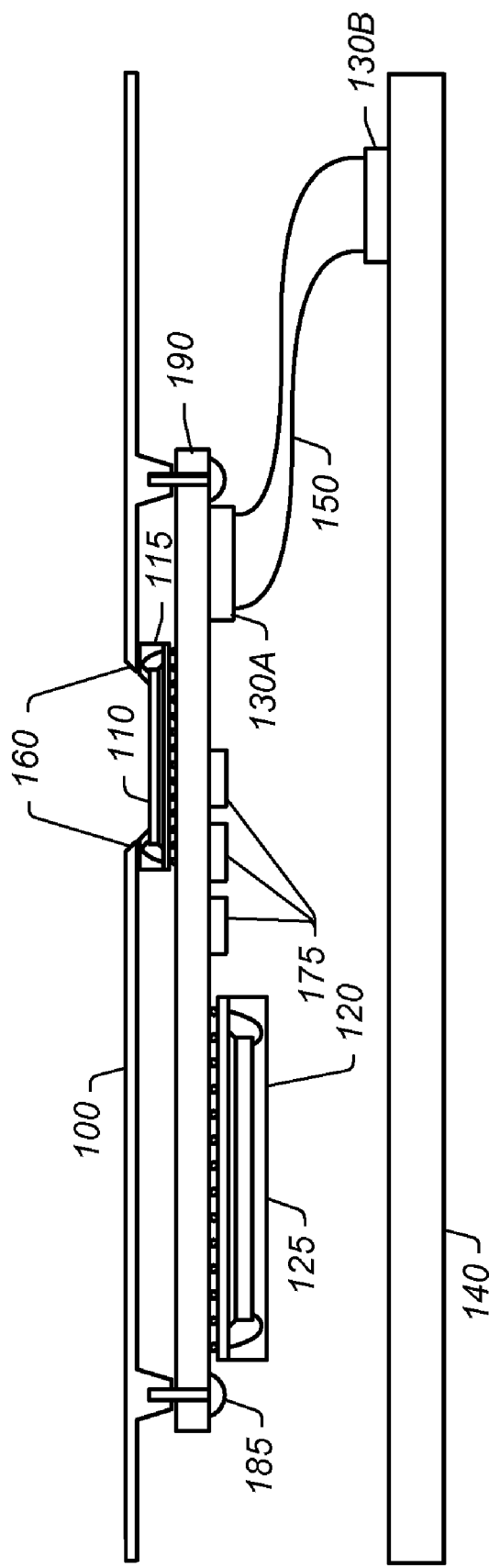
FIG. 1 is a diagram illustrating a conventional (prior art) fingerprint sensor system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION

Turning now to FIG. 1, a diagram illustrating a conventional prior art fingerprint sensor system is shown. The conventional fingerprint sensor system of FIG. 1 includes a motherboard 140 of the host system, which in the illustration is a laptop computer. The laptop computer has a housing top surface 100 and an aperture 160. The conventional fingerprint sensor system includes a miniature PCB 190 that is coupled to the motherboard 140 using a Mylar tape cable 150. Typically, the Mylar tape 150 will include a number of circuit wires or conductors that have either been embedded into or deposited thereon. As shown, mini PCB 190 and the motherboard 140 both include a connector 130A and 130B, respectively, for connecting the Mylar tape 150 between boards.

In addition, the conventional fingerprint sensor system includes a fingerprint sensor manufactured as part of an IC 110. The sensor IC 110 is packaged in a ball grid array (BGA) IC package 115. The sensor IC 110 is coupled to a number of buffering components 175 and/or a processing IC chip 120 using signal traces and through-hole vias (all not shown). The processing IC chip 120 is also shown packaged in a BGA IC package 125. The mini PCB 190 is physically mounted to the laptop top surface 100 using screws 185.

Figure 3:
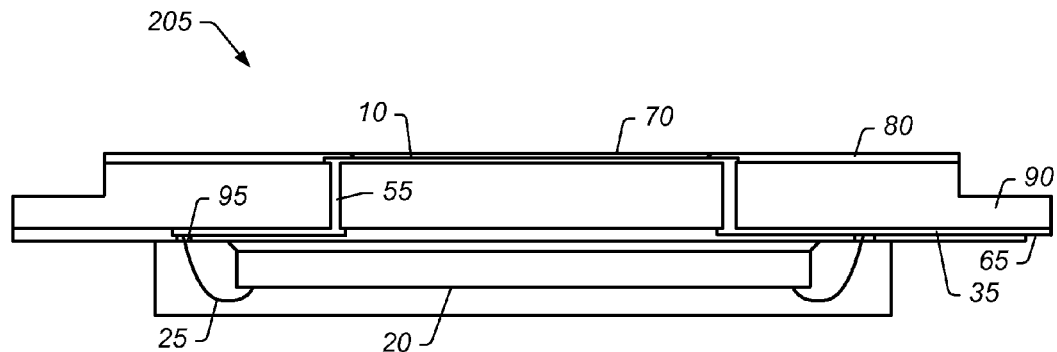
FIG. 3 is a side view diagram illustrating one embodiment of the fingerprint sensor system of FIG. 2.
Figure 4:
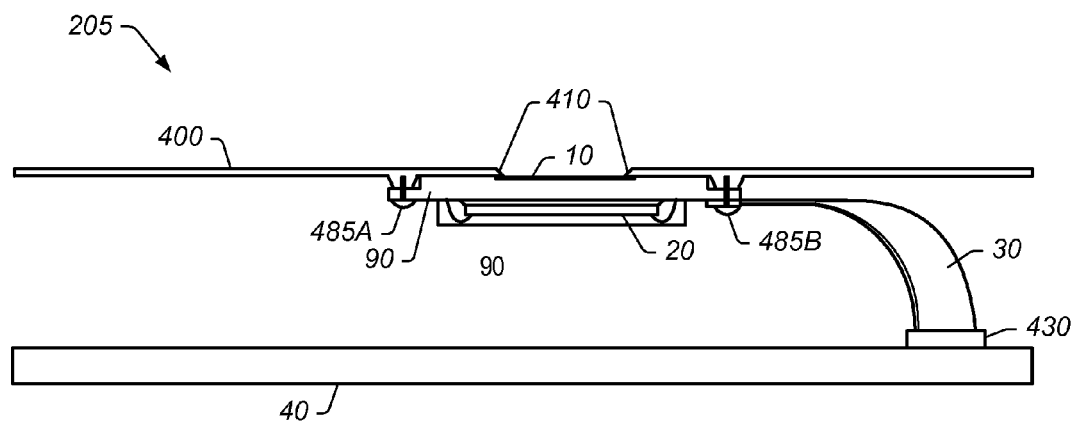
FIG. 4 is a side view diagram illustrating one embodiment of the fingerprint sensor system of FIG. 2 and FIG. 3 mounted to a device housing.

As described above, the conventional fingerprint sensor system shown in FIG. 1 includes several components. In addition, there is a considerable distance from the sensor IC 110 to the processing IC 120, thereby allowing the possibility of signal distortion and interference, as well as a possibly less than desirable mean time between failure (MTBF) due the component count. Lastly, the number of components adds to the cost of the fingerprint system. In contrast, as shown in FIG. 2 through FIG. 4 below, a low cost fingerprint sensor system is shown that includes fewer components and a simplified design.

Figure 2:
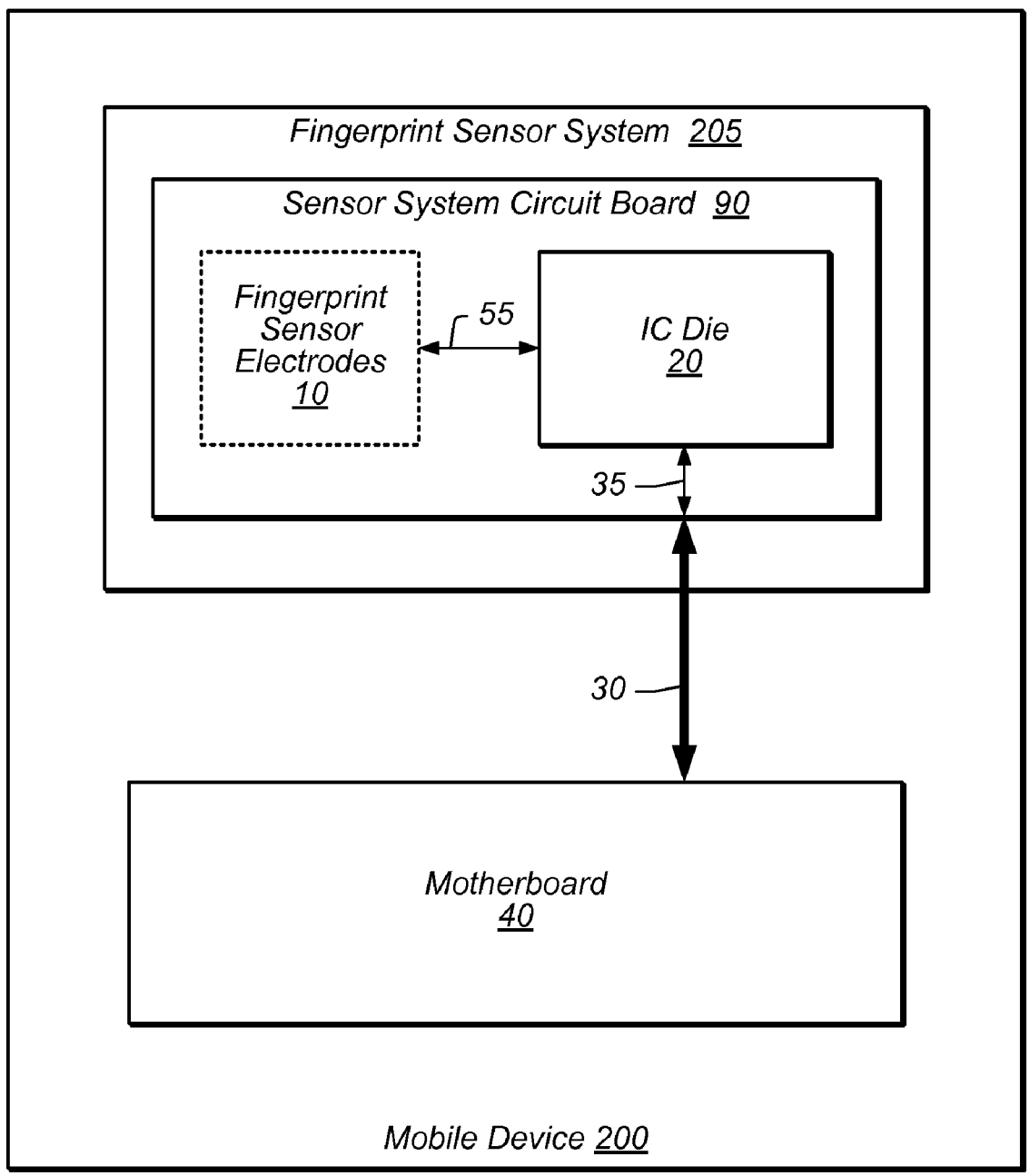
FIG. 2 is a block diagram of one embodiment of a mobile computing system including a fingerprint sensor system.

Turning to FIG. 2, a simplified block diagram of one embodiment of a mobile device 200 including a fingerprint sensor system 205 is shown. The mobile device 200 includes a motherboard 40 coupled to the sensor system circuit board 90 via a link 30. The sensor system circuit board 90 includes an integrated circuit (IC) die 20 that is coupled to fingerprint sensor array electrodes 10, by link 55.

In one embodiment, the fingerprint sensor array electrodes 10 may be an electrode array that is fabricated directly onto the top metal layer of the sensor system circuit board 90 using standard PCB layout and etching techniques. In various implementations, the sensor array may be fabricated using metal traces laid out into patterns of lines having varying lengths and varying pitches (i.e., distance between adjacent metal traces). The sensor may be a one or two-dimensional array. Accordingly, using a high-density pitch arrangement, a high quality sensor array may be formed. In doing so, the sensor array 10 may be representative of a capacitive fingerprint sensor. The sensor system circuit board 90 may be representative of a PCB, printed wire board (PWB), or the like. As such, the sensor system circuit board 90 may include a substrate made from dielectric material such as FR4, for example. In addition, the sensor system circuit board 90 may include signal contacts, signal traces, through-hole vias, and in certain cases, blind vias for electrically interconnecting the components.

In one embodiment, the IC die 20 may be representative of a processing circuit or application specific integrated circuit (ASIC) that may be configured to perform general purpose processing as well as signal processing tasks such as forming a fingerprint image or signature from the signals received from the sensor array 10. The IC dies 20 may also be configured in some embodiments, to compare that generated signature to other signatures stored within the IC die 20. In other embodiments, the IC die 20 may send the generated signature to other devices, such as a processor on the motherboard 40, for example, for the comparison. As such, the IC die 20 may perform signature generation, authentication and/or identification functions using any of a variety of signature generation, matching and authentication algorithms.

In one embodiment, the link 55 may include signal contacts, traces, and vias (shown in FIG. 3). In one embodiment, the link 30 may be representative of a flexible strip or film such as any of the films in the polyethylene terephthalate (PET) family, or the like, for example. It is noted that Mylar is one such PET film. The flexible strip may include circuit traces or wires to convey signals between the sensor system circuit board 90 and the motherboard 40.

Referring to FIG. 3, a side view diagram illustrating one embodiment of the fingerprint sensor system 205 of FIG. 2 is shown. It is noted that components that correspond to components shown in FIG. 2 are numbered identically for clarity and simplicity. As described above, the fingerprint sensor system includes a mini PCB 90 that includes a plurality of through-hole vias 55, contact pads 95, signal traces 35 and contacts 65. The PCB 90 also includes a solder mask 80 that covers portions of the PCB 90.

In the illustrated embodiment, the fingerprint sensor electrode array 110 is fabricated on the top surface of the mini PCB 90 and has a protective sensor coating 70. As depicted in FIG. 3, the IC die 20 is physically mounted to the bottom surface of the PCB 90 using, for example, a chip-on-board assembly procedure. As such there is no IC die packaging. The IC bonding wires 25 are bonded directly from pads on the IC to contact pads 95 on the PCB 90. The sensor array electrodes 10 may be connected either directly to the vias 55 or to contact pads in close proximity to the vias 55. Further, the contact pads 95 may be connected to contacts 65 using signal traces on the bottom surface, for example, of PCB 90. As shown in FIG. 4, the contacts 65 may directly mate to the flexible strip 30 without using a connector.

Referring to FIG. 4, a side view diagram illustrating one embodiment of the fingerprint sensor system of FIG. 2 and FIG. 3 mounted to a device housing is shown. As shown, the device includes a housing 400, which includes an aperture 410. The fingerprint sensor system is positioned such that the fingerprint sensor array electrodes are in alignment with the aperture 410 to allow a user to press a finger onto the sensor.

As mentioned above, the flexible strip 30 may mate with the PCB 90 at the contacts 65 without a connector. As shown, the mounting screws 485B are used to mount the PCB 90 to the housing 400. However, the screws 485B serve two purposes. More particularly, the screw(s) may also be used to compress the flexible strip against the contacts 65, and hold it in place, thus forming a connectorless electrical mating between the flexible strip and the contacts 65.

As shown in FIG. 2 through FIG. 4 there is only one integrated circuit (e.g., IC die 20), only one flexible strip connector, no BGA IC packaging, and no buffering circuits. This stands in contrast to the conventional fingerprint sensor system of FIG. 1. Accordingly, due to the shortened lead lengths between the sensor array 10 and the IC die 20, there may be an improvement in signal quality. Furthermore, as mentioned above, having fewer and simpler components may lessen the manufacturing cost, as well as possibly increasing the MTBF of the fingerprint sensor system 205.

It is noted that although the PCB 90 is described as having only two circuit layers (e.g., top and bottom) it is contemplated that additional circuit layers may be used as necessary. It is also noted that although the embodiments described above depict the device as a mobile device and/or a laptop, it is contemplated that in other embodiments the device may be any device that may utilize fingerprint sensor systems. For example, security systems, mobile phones, cash registers, stationary/desktop computers and servers, and the like may use fingerprint sensor systems. It is further noted that the terms top and bottom are used to for discussion purposes and do not limit the orientation of the circuit board or the components.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A fingerprint sensor system comprising:
   a circuit board including a first surface and a second surface;
   a fingerprint sensor array fabricated onto the first surface, wherein the fingerprint sensor array comprises a specific pattern of metal traces etched on the first surface of the circuit board, wherein the specific pattern comprises a plurality of metal lines having varying lengths and pitches;
   an integrated circuit die for processing information received from the fingerprint sensor is mounted to the second surface and electrically coupled to the fingerprint sensor array.

2. The system as recited in claim 1, wherein the circuit board further includes a plurality of electrical contacts fabricated onto one of the top surface or bottom surface, wherein the plurality of electrical contacts are coupled to the integrated circuit via a plurality of signal traces.

3. The system as recited in claim 2, further comprising a flexible strip including a plurality of signal traces mated directly to the plurality of electrical contacts of the circuit board without a connector, thereby forming a connectorless electrical mating between the flexible strip and the electrical contacts.

4. The system as recited in claim 3, wherein the flexible strip is mechanically secured to the circuit board by a screw that is used to secure the circuit board to another device.

5. The system as recited in claim 1, wherein the integrated circuit die is directly mounted and electrically bonded to the circuit board without having an integrated circuit package assembly.

6. The system as recited in claim 5, wherein the integrated circuit die is electrically bonded to the circuit board using electrical signal bonding wires that are bonded directly from bond pads on the integrated circuit die to contact pads formed on the circuit board.

7. The system as recited in claim 1, wherein the fingerprint sensor array comprises a capacitive the fingerprint sensor array.

8. The system as recited in claim 1, wherein the integrated circuit die is mounted to the second surface of the circuit board at a location directly opposite and in alignment with the fingerprint sensor array location on the first surface of the circuit board.

9. A mobile device comprising:
a housing;
a motherboard mounted within the housing;
a fingerprint sensor system mounted to the housing and coupled to the motherboard, wherein the fingerprint sensor system includes:
  a circuit board including a first surface and a second surface;
  a fingerprint sensor array fabricated onto the first surface, wherein the fingerprint sensor array comprises a specific pattern of metal traces etched on the first surface of the circuit board, wherein the specific pattern comprises a plurality of metal lines having varying lengths and pitches;
  an integrated circuit die for processing information received from the fingerprint sensor mounted to the second surface and electrically coupled to the fingerprint sensor array;
  wherein the circuit board is mounted to the housing such that the fingerprint sensor array is positioned in alignment within an aperture in the housing.

10. The mobile device as recited in claim 9, wherein the fingerprint sensor array comprises a capacitive the fingerprint sensor array.

11. The mobile device as recited in claim 9, wherein the integrated circuit die is mounted to the second surface of the circuit board at a location directly opposite and in alignment with the fingerprint sensor array location on the first surface of the circuit board.

12. The mobile device as recited in claim 9, wherein the circuit board further includes a plurality of electrical contacts fabricated onto one of the top surface or bottom surface, wherein the plurality of electrical contacts are coupled to the integrated circuit via a plurality of signal traces.

13. The mobile device as recited in claim 12, further comprising a flexible strip including a plurality of signal traces mated directly to the plurality of electrical contacts of the circuit board without a connector, thereby forming a connectorless electrical mating between the flexible strip and the electrical contacts.

14. The mobile device as recited in claim 13, wherein the flexible strip is mechanically secured to the circuit board by a screw used to secure the circuit board to the housing.

15. The mobile device as recited in claim 9, wherein the integrated circuit die is directly mounted and electrically bonded to the circuit board without having an integrated circuit package assembly.

16. The mobile device as recited in claim 15, wherein the integrated circuit die is electrically bonded to the circuit board using electrical signal bonding wires that are bonded directly from bond pads on the integrated circuit die to contact pads formed on the circuit board.

* * * * *

UNITED STATES PATENT AND TRADEMARK OFFICE
CERTIFICATE OF CORRECTION

PATENT NO. : 8,149,001 B2
APPLICATION NO. : 12/359056
DATED : April 3, 2012
INVENTOR(S) : Iliev et al.

It is certified that error appears in the above-identified patent and that said Letters Patent is hereby corrected as shown below:

In the Claims:

Column 4, Line 34, claim 1, please delete "sensor is mounted" and substitute: -- sensor mounted --.

Signed and Sealed this
Third Day of July, 2012

David J. Kappos
*Director of the United States Patent and Trademark Office*